(12) United States Patent
Easton (10) Patent No.: US 9,743,767 B1
(45) Date of Patent: Aug. 29, 2017

(54) TOOL-FREE QUICK INSTALL RAIL-KIT FOR RACK SYSTEMS

(71) Applicant: Seagate Technology LLC, Cupertino, CA (US)

(72) Inventor: Michael John Easton, Salisbury (GB)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/098,962

(22) Filed: Apr. 14, 2016

(51) Int. Cl.
| A47B 96/00 | (2006.01) |
| A47B 96/07 | (2006.01) |
| A47B 47/00 | (2006.01) |
| H05K 7/14 | (2006.01) |
| A47B 57/48 | (2006.01) |

(52) U.S. Cl.
CPC .......... *A47B 96/07* (2013.01); *A47B 47/0083* (2013.01); *A47B 57/487* (2013.01); *H05K 7/1489* (2013.01)

(58) Field of Classification Search
CPC ........ A47B 88/0418; A47B 2088/0433; A47B 96/07; A47B 47/0083; A47B 57/487; A47B 96/06; A47B 57/14; A47B 57/16; F16B 21/06; H05K 7/1489; H05K 7/18; H05K 7/183; G06F 1/187
USPC .............. 248/218.4, 220.21, 220.22, 220.31, 248/220.41, 220.43, 221, 11, 222.11, 248/222.12; 211/192
See application file for complete search history.

(56) References Cited

U.S. PATENT DOCUMENTS

| 3,144,945 | A  | * | 8/1964  | Seiz ...................... | A47B 57/485 211/192 |
| 6,749,275 | B2 | * | 6/2004  | Cutler .................... | A47B 88/43 248/243 |
| 6,840,388 | B2 | * | 1/2005  | Mayer ................... | A47B 57/485 211/26 |
| 6,891,727 | B2 | * | 5/2005  | Dittus ................... | H05K 7/1489 211/26 |
| 6,926,378 | B2 | * | 8/2005  | Greenwald ............ | A47B 88/43 312/223.1 |
| 6,929,339 | B1 | * | 8/2005  | Greenwald ............ | A47B 88/43 211/26 |
| 6,957,878 | B2 | * | 10/2005 | Greenwald ............ | A47B 88/43 312/223.1 |

(Continued)

FOREIGN PATENT DOCUMENTS

DE  202008010220  11/2008

*Primary Examiner* — Christopher E Garft
(74) *Attorney, Agent, or Firm* — Taylor English Duma LLP (57) ABSTRACT

Tool-free, quick-install rail-kits for installing equipment in rack systems. A telescoping rail body has an inner panel slidably fastened to an outer panel. A self-latching mechanism is disposed at opposite ends of the inner and outer panels. Each self-latching mechanism comprises a latching clip and a locking lever. The latching clip has a catch surface, and is pivotally fastened to the panel body and biased by a biasing member in a latched position. The latching clip is configured to pass through an aperture of a rack post and engage an outer surface of the post with the catch surface. The locking lever is positioned on an inward facing surface of each panel and configured to open inwardly to unlock the latching clip allowing the latching clip to pivot, and to close flush with the inward facing surface to lock the latching clip in the latched position.

9 Claims, 5 Drawing Sheets

(56) References Cited

U.S. PATENT DOCUMENTS

| | | | | |
|---|---|---|---|---|
| 7,192,103 B2* | 3/2007 | Hamilton | A47B 88/43 | 211/175 |
| 7,281,633 B2* | 10/2007 | Hartman | G06F 1/183 | 211/192 |
| 7,318,532 B1* | 1/2008 | Lee | H05K 7/1405 | 211/26 |
| 7,552,899 B2* | 6/2009 | Chen | A47B 88/43 | 211/26 |
| 7,641,297 B2* | 1/2010 | Huang | H05K 7/1489 | 211/26 |
| 7,699,279 B2* | 4/2010 | Chen | A47B 88/43 | 248/220.22 |
| 7,731,142 B2 | 6/2010 | Chen et al. | | |
| 7,798,581 B2* | 9/2010 | Chen | G06F 1/183 | 211/26 |
| 7,857,145 B2* | 12/2010 | Mushan | A47B 88/43 | 211/26 |
| 7,930,812 B2 | 4/2011 | Curnalia et al. | | |
| 7,934,607 B2* | 5/2011 | Henderson | H05K 7/1489 | 211/175 |
| 8,104,626 B2* | 1/2012 | Huang | A47B 88/43 | 211/26 |
| 8,146,756 B2* | 4/2012 | Brock | A47B 96/06 | 211/192 |
| 8,353,494 B2* | 1/2013 | Peng | A47B 88/43 | 211/192 |
| 8,371,454 B2* | 2/2013 | Chen | H05K 7/1421 | 211/26 |
| 8,550,416 B2* | 10/2013 | Yu | H05K 7/1489 | 248/241 |
| 8,602,225 B2* | 12/2013 | Lin | A47B 88/43 | 211/26 |
| 8,727,138 B2* | 5/2014 | Dittus | H05K 7/1489 | 211/26 |
| 9,066,591 B2* | 6/2015 | Chen | A47B 88/044 | |
| 9,107,322 B2 | 8/2015 | Chuang | | |
| 9,125,489 B2* | 9/2015 | Chen | A47B 88/044 | |
| 9,375,087 B1* | 6/2016 | Chen | A47B 88/43 | |
| 2001/0040203 A1* | 11/2001 | Brock | H02B 1/34 | 248/222.11 |
| 2002/0043508 A1* | 4/2002 | Lewis | A47B 57/44 | 211/26 |
| 2004/0217073 A1 | 11/2004 | Dobler et al. | | |
| 2007/0025812 A1 | 2/2007 | Tsai | | |
| 2008/0078899 A1* | 4/2008 | Chen | A47B 88/43 | 248/220.21 |
| 2009/0114785 A1* | 5/2009 | Huang | A47B 88/43 | 248/220.31 |
| 2010/0072153 A1* | 3/2010 | Chen | H05K 7/1421 | 211/183 |
| 2010/0200523 A1 | 8/2010 | Henderson | | |
| 2012/0134743 A1* | 5/2012 | Yu | H05K 7/1489 | 403/330 |
| 2012/0145850 A1* | 6/2012 | Yu | H05K 7/1489 | 248/220.22 |
| 2012/0292274 A1* | 11/2012 | Lin | A47B 88/43 | 211/86.01 |
| 2013/0056432 A1* | 3/2013 | Lin | A47B 88/43 | 211/123 |
| 2013/0112638 A1* | 5/2013 | Dittus | H05K 7/183 | 211/123 |
| 2013/0241378 A1* | 9/2013 | Zhang | H05K 5/0221 | 312/223.2 |
| 2014/0363108 A1* | 12/2014 | Chen | A47B 88/044 | 384/22 |
| 2015/0027969 A1 | 1/2015 | Bold et al. | | |
| 2015/0048041 A1 | 2/2015 | Chuang | | |
| 2015/0048227 A1* | 2/2015 | Chuang | F16B 9/023 | 248/228.4 |
| 2015/0069196 A1* | 3/2015 | Chen | A47B 47/0058 | 248/218.4 |
| 2015/0084494 A1* | 3/2015 | Tonthat | H05K 7/183 | 312/333 |
| 2015/0173510 A1* | 6/2015 | Yu | H05K 7/1489 | 384/22 |
| 2015/0335156 A1* | 11/2015 | Chen | A47B 96/07 | 248/219.1 |
| 2016/0157610 A1* | 6/2016 | Chen | A47B 88/43 | 248/219.3 |
| 2016/0165746 A1* | 6/2016 | Byargeon | G06F 1/16 | 248/231.31 |

\* cited by examiner

TOOL-FREE QUICK INSTALL RAIL-KIT FOR RACK SYSTEMS

BRIEF SUMMARY

The present disclosure relates to tool-free, quick-install rail-kits for installing equipment in rack systems. According to some embodiments, a rail-kit comprises a telescoping rail body comprising an inner panel and an outer panel slidably fastened to one another. A self-latching mechanism is disposed at opposite ends of the inner panel and the outer panel, with each self-latching mechanism comprising a latching clip and a locking lever. The latching clip has at least one catch surface, and is pivotally fastened to the panel body and biased by a biasing member in a latched position. The latching clip is configured to pass through an aperture of a rack post of the rack system and engage an outer surface of the rack post with the at least one catch surface. The locking lever is positioned on an inward facing surface of each of the panel bodies and configured to open inwardly to unlock the latching clip allowing the latching clip to pivot, and to close flush with the inward facing surface to lock the latching clip in the latched position.

According to further embodiments, a self-latching mechanism configured to be affixed to a rail-kit comprises a latching clip pivotally fastened at an end of the rail-kit and having a distal end configured to pass through an aperture in a rack post of the rack system and to deflect the latching clip while passing through the aperture. The latching clip further has a first catch surface and a second catch surface, the first catch surface configured to pass through small apertures of the rack post and engage an outer surface of the rack post, and the second catch surface configured to pass through large apertures of the rack post and engage the outer surface of the rack post. The self-latching mechanism further comprises a biasing member configured to bias the latching clip in a latched position.

According to further embodiments, a method of installing a rail-kit in an equipment rack comprises positioning the rail-kit between a first rack post and a second rack post of the equipment rack, the first rack post and the second rack post defining a front and a rear of the equipment rack. The length of the rail-kit is extended by horizontally sliding a first panel body with respect to a second panel body such that a distal end of a first latching clip pivotally attached to an end of the first panel body engages an aperture in the first rack post and the distal end of a second latching clip pivotally attached to the second panel body engages an aperture in the second rack post.

The length of the rail-kit is further extended to cause the first latching clip to be deflected out of a latched position by the aperture in the first rack post with the distal end positioned to pass through the aperture in the first rack post, the first latching clip biased in the latched position by a first biasing member. The length of the rail-kit is further extended to cause the second latching clip to be deflected out of a latched position by the aperture in the second rack post with the distal end positioned to pass through the aperture in the second rack post, the second latching clip biased in the latched position by a second biasing member. The length of the rail-kit is further extended until a first engagement surface of the first latching clip passes through the aperture in the first rack post and engages an outer surface of the first rack post, the first latching clip pulled back into the latched position by the first biasing member, and a first engagement surface of the second latching clip passes through the aperture in the second rack post and engages an outer surface of the second rack post, the second latching clip pulled back into the latched position by the second biasing member. Finally, a first locking lever attached to the first panel body is closed and a second locking lever attached to the second panel body is closed, the first locking lever and the second locking lever configured to lock the first latching clip and the second latching clip, respectively, in the latched position.

These and other features and aspects of the various embodiments will become apparent upon reading the following Detailed Description and reviewing the accompanying drawings.

BRIEF DESCRIPTION OF THE DRAWINGS

In the following Detailed Description, references are made to the accompanying drawings that form a part hereof, and that show, by way of illustration, specific embodiments or examples. The drawings herein are not drawn to scale. Like numerals represent like elements throughout the several figures.

DETAILED DESCRIPTION

The following detailed description is directed to tool-free, quick-install rail-kits for installing equipment in rack systems. In some embodiments that equipment can be classified as heavy weight equipment. An equipment rack system capable of handling heavy components comprises four rack posts that support rack-mountable chassis of equipment to be installed. Equipment chassis that are not directly mountable in the four-post rack may be installed on shelves or using rails or slides (also referred to herein as "rail-kits") that are mounted in pairs on either side of the rack, with the equipment then sliding into the rack along the rails. Some systems have specifications for a 19-inch rack, including the size of the rack unit ("RU" or "U"), type and size of mounting holes or "apertures" in the rack posts (smaller round holes, larger square holes, threaded, non-threaded, etc.), vertical hole spacing, horizontal hole spacing, rack opening, front panel width, and the like.

Rail-kits for four-post rack systems can be heavy and difficult and/or cumbersome to install in crowded data centers where many racks are installed side-by-side and access is only from the inside of the rack-space. Installation can take a long time and, if done incorrectly, can cause failure of the rack mounting and equipment damage. For heavy equipment chassis, installation into an incorrectly installed rail-kit can also be dangerous to the installers. Installation methods and instructions need to be followed closely and proper tools need to be used to ensure a safe installation, and sometimes more than one person may be required to install the rails and equipment.

Tool-less rail-kit solutions may use spring pins on either end of the rail-kit to bear the load of the equipment. These spring pins may not be strong enough to bear the weight of heavy-weight equipment chassis, such as a chassis holding numerous data storage drives with controllers, power supplies, and cooling equipment in a densely populated storage solution. Further, the locking mechanisms of tool-less rail-kits may be vulnerable to damage by being accidentally deflected or disturbed during installation, which can inadvertently disrupt their latches causing the equipment to fall.

The embodiments described herein provide a rail-kit designed for heavy-weight equipment chassis that may be quickly and easily installed into a 19-inch four-post rack or other rack system without the use of tools and without the need for the installer to hold the potentially heavy, high-strength rail-kit in place for a long time. Installation only requires access from the front and inside of the rack, which makes it suitable for ultra-dense rack systems for very heavy storage systems. According to embodiments, the rail-kit comprises a telescoping rail body that allows the depth of the rail-kit to be easily adjusted to fit between the front and rear posts of the four-post rack, with rigidly-mounted, load-bearing pegs on either end designed to engage the mounting holes on the opposite posts and bear the weight of installed equipment.

The rail-kit further includes a spring-loaded, self-latching mechanism on each end of the rail body that allows the ends of rail-kit to be held against the posts, keeping the load-bearing pegs in position without the need for screws or other fasteners. The front and rear self-latching mechanisms remove the need for a central locking mechanism or the requirement of tightening screws or bolts on the telescoping rail body in order to hold the rail-kit in place after installation in the rack. According to some embodiments, a latching clip of the self-latching mechanism and/or the load-bearing pegs may be configured to fit with both the small, round mounting holes of a 19-inch rack post, as well as the larger, square mounting holes.

In addition each self-latching mechanism includes a locking lever that allows the latching clip to deflect while open to engage the rack posts as the rail-kit is installed in the rack and then can be closed to prevent the latching clip from disengaging the rail posts while equipment is installed. In some embodiments, the locking lever may include a detent that holds the locking lever open during installation of the rail-kit in the rack. In further embodiments, the locking lever may be positioned such that an equipment chassis cannot be slid into the rail-kit while the lever(s) are open. Alternatively or additionally, the locking lever(s) may be positioned such that the insertion of the equipment chassis may force the locking lever closed, thus locking the self-latching mechanisms and the rail-kit in place for safe, stable installation in the rack system.

Figure 1:
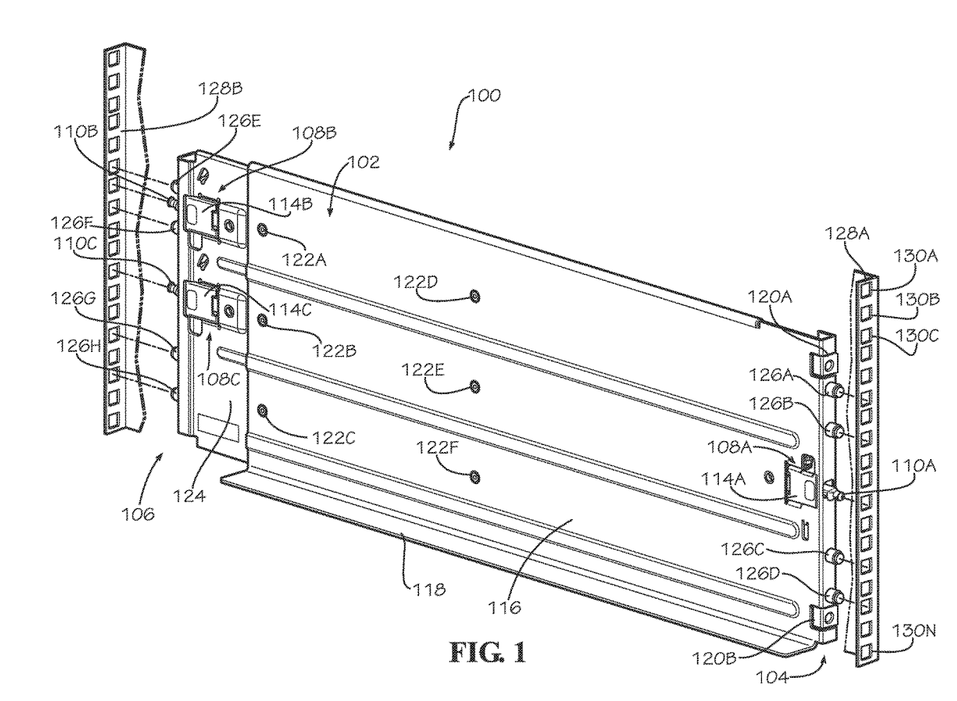
FIG. 1 is a perspective view of a tool-free rail-kit according to embodiments described herein positioned for installation between two rack posts.

Referring now to FIG. 1, according to embodiments, the rail-kit 100 is designed to be mounted between a front rack post 128A and a rear rack post 128B (referred to herein generally as rack posts 128). The rack posts 128 may include a number of mounting holes or apertures, such as apertures 130A-N (referred to herein generally as apertures 130) shown in FIG. 1. The apertures 130 are intended for mounting rack mountable equipment chassis, shelves, rail-kits, and the like and may be vertically spaced. The apertures 130 may comprise smaller round holes, larger square holes, or some combination of the two according to specification(s) for the rack posts 128. The embodiments of the rail-kit 100 disclosed are capable of mounting to rack posts 128 with apertures 130 of either format without modification or alteration.

The rail-kit 100 comprises a telescoping body 102 having an outer panel 124 and an inner panel 116 with the inner and outer panels slidably mated to one another to allow "telescoping" of the panels relative to one another. The telescoping adjustment allows the rail-kit 100 to be shortened and lengthened to facilitate installation between the front and rear rack posts 128A, 128B. The inner panel 116 and outer panel 124 may be mated by a series of fasteners 122A-F (referred to herein generally as fasteners 122), such as set screws, thumb-screws, knobs or similar, that hold the panels together while allowing for the telescoping movement of the panels. According to some embodiments, the fasteners 122 do not require tools for tightening. In further embodiments, one or more inserts or spacers made of nylon or similar materials may be placed between the inner panel 116 and outer panel 124 to prevent binding of the panels during telescoping motion and without requiring tightening or loosening of the fasteners 122.

According to some embodiments, the inner panel 116 and/or outer panel 124 may include one or more ridges or channels formed or attached to panel body to provide stiffening to the metalwork. In further embodiments, the inner panel 116 includes a horizontal ledge 118 or shelf extending inward and intended for supporting installed equipment. In typical use, a pair of horizontal rail-kits 100 will be installed between opposite pairs of vertical rack posts 128 and oriented such that the rail-kits 100 are parallel to one another with the inner panels 116 of the two rail-kits 100 and the ledges 118 of the inner panels facing one another (not shown). Computer or electronic equipment housed in a chassis or cabinet, can then be installed in the rack system by sliding the equipment into and resting it upon the ledges 118 of the two respective rail-kits 100.

As shown in FIG. 1, the rail-kit 100 has two opposite ends, a front end 104 and a rear end 106 opposite the front end. In some embodiments, the front end 104 is defined by an end of the inner panel 116 and the rear end 106 is defined by an end of the outer panel 124. Each end of the rail-kit 100 includes one or more self-latching mechanisms, such as self-latching mechanisms 108A-C (referred to herein generally as self-latching mechanism 108), and one or more load-bearing pegs, such as load-bearing pegs 126A-H (referred to herein generally as load-bearing pegs 126). Both the self-latching mechanisms 108 and load-bearing pegs 126 are configured to engage the apertures 130 of the rack posts 128, with the load-bearing pegs 126 supporting the vertical load of the rail-kit 100 and any installed equipment, and the self-latching mechanisms 108 keeping the load-bearing pegs 126 engaged with the apertures 130 of the rack posts 128.

In some embodiments, the self-latching mechanism 108 and the load-bearing pegs 126 are configured to fit both smaller round holes and larger square holes found in the rack posts 128 of a 19-inch rack system, as described in more detail herein. One or both ends 104, 106 may additionally include one or more fastening points, such as fastening points 120A and 120B (referred to herein generally as a fastening point 120). The fastening points 120 provide a means for securing equipment, such as a cabinet or chassis, to the rail-kit 100 and the rack system, thus preventing undesired movement of the equipment along the rail ledge 118. In some embodiments, the fastening points 120 define a threaded hole or aperture for receiving a fastener, such as a bolt, screw, or equivalent.

As further shown in FIG. 1, each self-latching mechanism 108 includes a latching clip, such as latching clips 110A-110C (referred to herein generally as latching clip 110), and a locking lever, such as locking levers 114A-C (referred to herein generally as a locking lever 114). Each latching clip 110 is configured to engage an aperture 130 of the respective rack post 128 and hold the flanking load-bearing pegs 126 engaged with the rack post while each locking lever 114 is configured to lock the corresponding latching clip 110 in an engaged or "latched" position for safe installation of the equipment chassis into the rail-kit 100.

Figure 2:
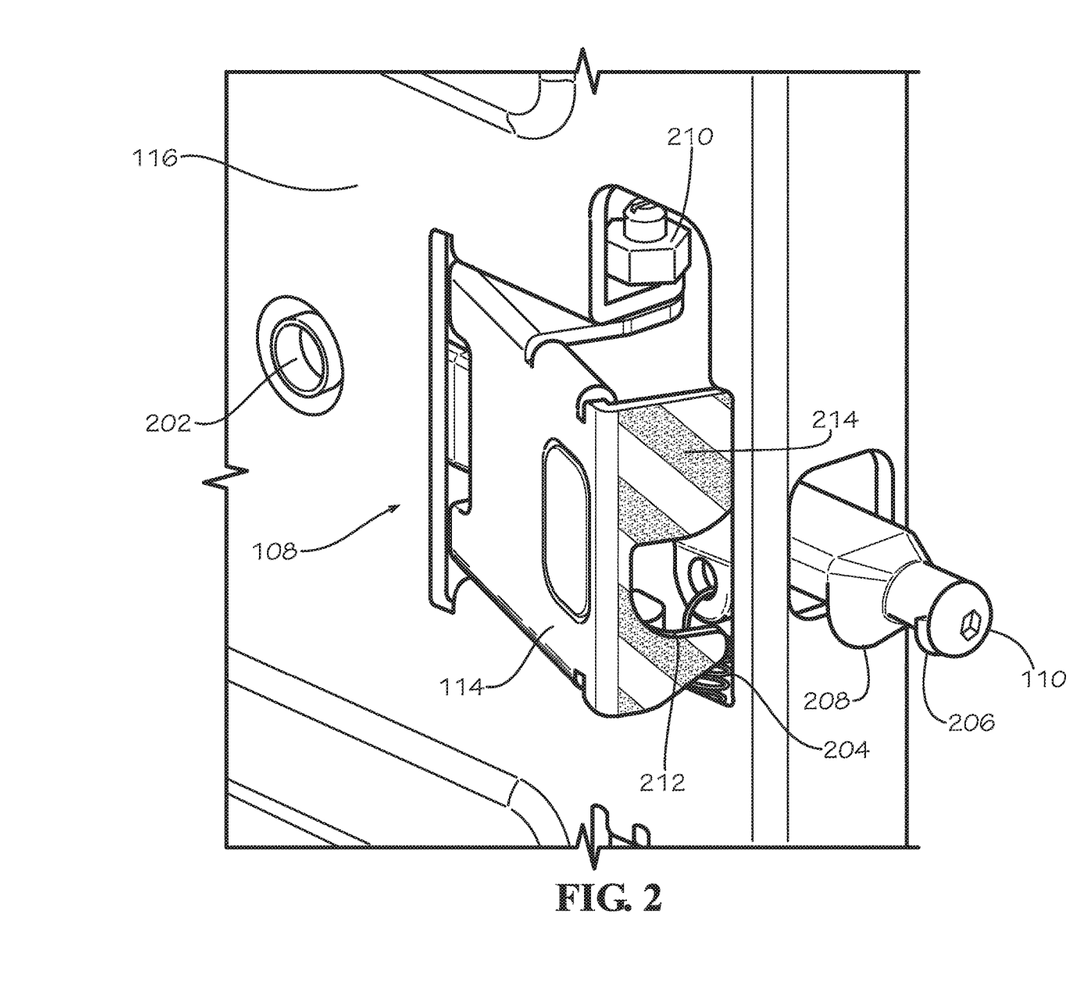
FIG. 2 is a perspective view showing further details of a self-latching mechanism and locking lever on an end of the rail-kit, according to embodiments described herein.
Figure 3:
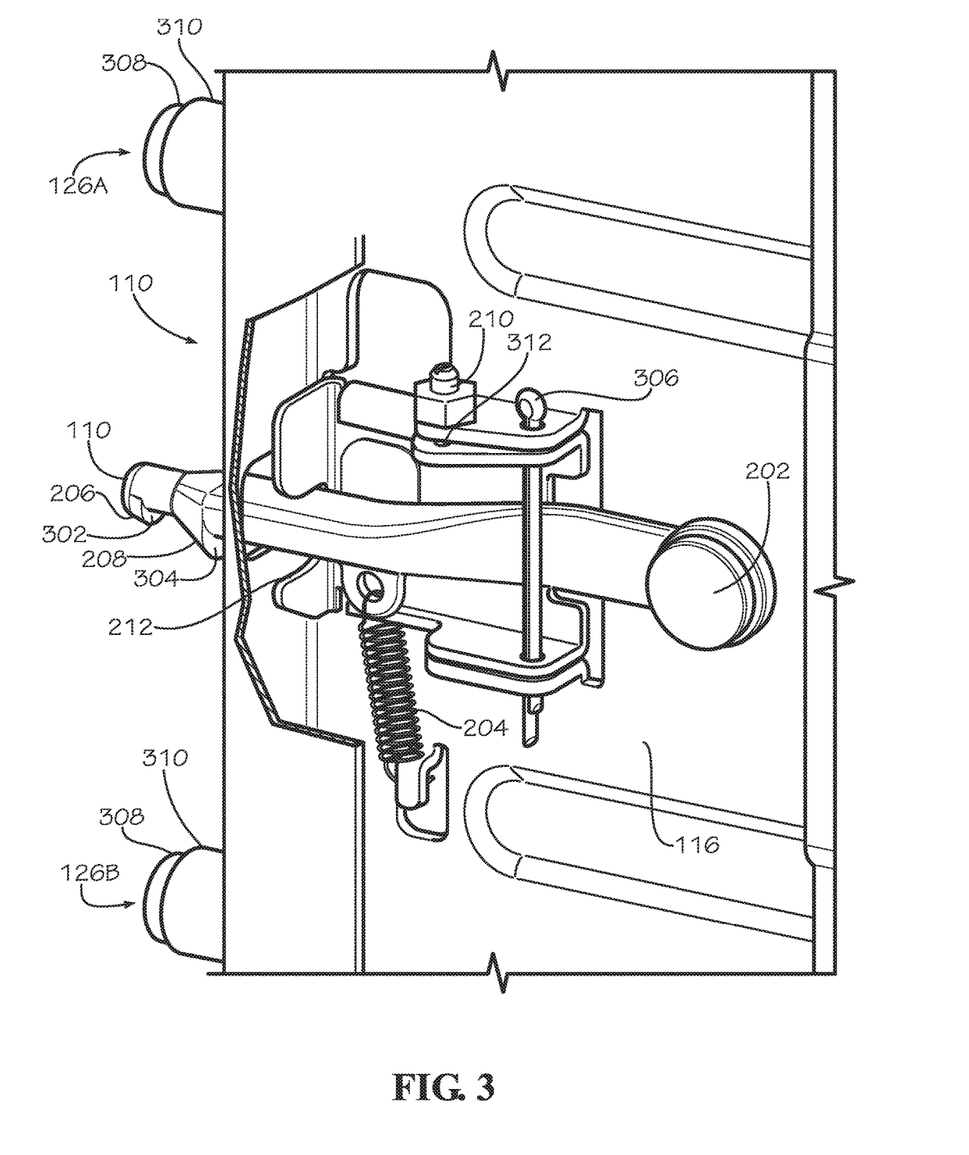
FIG. 3 is a perspective view of an opposite side showing additional details of the self-latching mechanism and locking lever, according to embodiments described herein.

As shown in FIGS. 2 and 3, the latching clip 110 is hingedly mounted to the respective inner or outer panel 116, 124 with a latch hinge 202 and biased to remain in the latched position by a biasing member 204, which can be a spring, elastic band, or the like. The latching clip 110 includes a protruding portion that extends past the end of the rail-kit 100 through a latch hole 216 defined in the end of the respective panel. According to some embodiments, the latching clip 110 includes a first catch 206 and a second catch 208 with the first catch 206 proximate to the end of the protruding latching clip 110 and the second catch 208 defined along the protruding portion of the latching clip 110 closer to the panel end. Each catch may be chamfered to aid in insertion into an aperture 130 or a rack post 128. In some embodiments, the first catch 206 is smaller than the second catch 208 and is configured to engage the smaller, round apertures 130 of a 19-inch equipment rack, while the second catch 208 is configured to engage the larger square apertures of such as rack.

According to some embodiments, the latching clip 110 is capable of rotating on the latch hinge 202 about and between the latched position and an engagement position, and the latch hole 216 may be sized and situated to allow for the necessary movement of the latching clip 110 between these positions while limiting excessive movement significantly beyond the range of these positions. The biasing member 204 may be connected between the latching clip 110 and the panel body, biasing the latching clip 110 towards the latched position. This feature aids in the installation of the rail-kit 100 by eliminating the need for manual access to the latching clip 110 to move the latching clip into the engagement positioned.

The locking lever 114 is capable of rotating about an essentially vertical axis and between an "open" position and a "closed" position. The locking lever 114 has a cutout defining a locking notch 212 sized to engage the body of the latching clip 110 when the locking lever 114 is closed to limit the travel of the latching clip about the latch hinge 202, thereby securing the latching clip 110 in the latched position. As shown in FIG. 2, with the locking lever 114 in the open position, the locking lever 114 protrudes from the inner face of the respective panel and the locking notch 212 disengages the body of latching clip 110 allowing it to travel between the latched position and engagement positions. With the locking lever 114 in the closed position, the locking lever 114 lies flush with the inner face of the respective panel and the locking notch 212 engages the body of the latching clip 110, securing it in the latched position, as shown in FIG. 3. Consequently, the self-latching mechanism 108 provides a double-locking effect when installed, as the latching clip 110 itself locks into the aperture 130 of the rack post 128 and the locking lever 114 then locks the latching clip 110 into the latched position, preventing it from disengaging.

According to further embodiments, the locking lever 114 cannot be moved to the closed position if the latching clip 110 is not in the latched position as the body of the latching clip 110 will misalign with the locking notch 212 and the locking lever 114 will be prevented from moving to the closed position due to the interference. In some embodiments, the self-latching mechanism 108 includes a spring-loaded detent assembly 210 which engages indentations in the locking lever 114 corresponding to the open and/or closed position such that once the locking lever has been moved to either position, it is biased to remain in that position. In additional embodiments, the inner or outer panel 116, 124 defines a cutout adjacent to the locking lever 114 which allows the insertion of a tool or finger from the inside of the panel body, through the panel, and behind the locking lever 114 to allow pulling the locking lever 114 out from the flush, closed position to the open position. The portion of the locking lever 114 proximate to the cutout can also include a rolled edge to eliminate sharp edges and protect the user from cuts should a finger be used to open the locking lever 114.

As further shown in FIG. 2, when in the open position, the protrusion of the locking lever 114 from the panel's inner face interferes with the installation of equipment on the rail ledge 118, according to embodiments. Additionally, the end of the locking lever 114 may include markings 214 for increased visibility. The markings may be a sticker, paint, engraving, or the like, and the markings 214 may be in a high visibility color, such as bright orange, or include a high visibility pattern, such as yellow and black striping. Therefore, the locking lever 114 provides both a visible indicator and a physical deterrent preventing the installation of equipment when the rail-kit 100 is not fully secured by means of the locking lever 114 being closed. Alternatively, the locking lever 114 may be oriented such that insertion of the equipment chassis into the rail-kit 100 forces the locking lever 114 from the open position to the closed position. Additionally, once the equipment chassis is in place on the rail ledges 118, the equipment itself interferes with movement of the locking lever 114 and prevents it from moving from the closed to the open position. Consequently, once the equipment chassis is installed in the rail-kit 100, the locking lever 114 cannot be opened until the equipment is uninstalled.

FIG. 2 shows the self-latching mechanism 108 with the locking lever 114 in the open position. As shown, the locking notch 212 is disengaged from the body of the latching clip 110 and the latching clip 110 is free to raise into the engagement position, resisted only by tension from the biasing member 204. The biasing member 204 tends to bias the latching clip 110 in the latched position unless acted upon by an outside force. For example, inserting the distal end of the latching clip 110 into an aperture 130 of a rack post 128 provides a sufficient force to deflect the latching clip 110 as the first catch 206 and/or the second catch 208 push against the edge of the aperture 130, thereby rotating the latching clip 110 into the engagement position before snapping back into the latched position under spring tension as the catch clears the outer edge of the aperture 130.

FIG. 3 shows the self-latching mechanism 108 the self-latching mechanism 108 with the locking lever 114 in the closed position. As shown, the locking notch 212 engages the body of the latching clip 110 preventing it from moving out of the latched position. According to embodiments, the locking lever 114 may be attached to the inner or outer panel 116, 124 by means of the locking lever hinge pin 306. FIG. 3 further depicts the spring-loaded detent assembly 210 which is positioned to engage indentations, such as indentation 312, on the locking lever 114. When the locking lever 114 is moved to the open or closed position, the spring-loaded detent assembly 210 snaps into the respective indentation 312 and biases the locking lever 114 to remain in that respective position unless acted upon by an outside force, thus prevents the locking lever 114 from freely rotating between positions. For example, the spring-loaded detent assembly 210 may be configured to hold the locking lever 114 in the opened position while the rail-kit 100 is being installed in the rack system. This feature aids in the installation of the rail-kit 100 into racks to which access may be limited, especially at the back of the rack.

As shown in FIG. 3, the first catch 206 of the latching clip 110 comprises a first catch surface 302 and the second catch 208 comprises a second catch surface 304. When the latching clip 110 is inserted through a small, round aperture 130 of a 19-inch equipment rack, the first catch surface 302 snaps over the edge of the aperture 130 and engages the outer surface of the rack post 128 preventing the latch clip from pulling out of the aperture 130. Likewise, when the latching clip 110 is inserted through a larger, square aperture 130 of a rack post 128, the second catch surface 304 snaps over the edge of the aperture 130 and engages the outer surface of the rack post 128 preventing the latch clip 110 from pulling out of the aperture 130.

As further shown in FIG. 3, the load-bearing pegs 126 at each end of the rail-kit 100 may be similarly configured to engage with both the smaller, round apertures 130 and the larger, square apertures 130 defined by the rack post 128. The load-bearing pegs 126 support the weight of the rail-kit 100 and any equipment chassis mounted therein, thereby preventing the self-latching mechanism 108 from bearing the weight and interfering with its operation. The load-bearing pegs 126 are rigidly attached to and extend essentially horizontally from the ends defined by the inner panel 116 and outer panel 124 of the rail-kit 100. According to some embodiments, the load-bearing pegs 126 have two engagement surfaces of two differing diameters: a smaller diameter first engagement surface 308 distal from the end of the panel and a larger diameter second engagement surface 310 proximate to the panel end. Each surface includes a chamfer to aid in insertion into the respective aperture 130 of the rack post 128. In some embodiments, the cross-section of the second engagement surface 310 may be square and sized to fit the square apertures 130 of a 19-inch rack post 128.

Figure 4A:
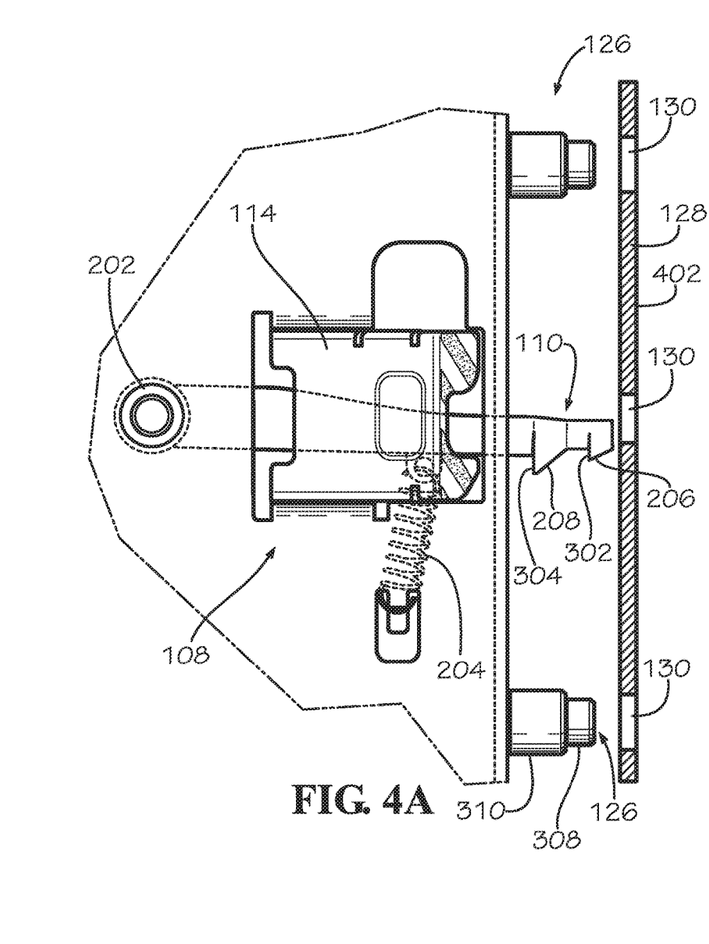
FIGS. 4A-4D are side views of the rail-kit showing the details of installation of the rail-kit in rack posts for both round holes and square holes, according to embodiments described herein.

FIGS. 4A-4D show the action of the self-latching mechanism 108 and the load-bearing pegs 126 as they engage the corresponding apertures 130 of the rack posts 128 during installation of the rail-kit 100 into the equipment rack. The rail-kit 100 is positioned between the front rack post 128A and the rear rack post 128B of the rack with the latching clip(s) 110 and the load-bearing pegs 126 on either end of the rail-kit 100 aligned with corresponding apertures 130 in the respective rack posts 128, as shown in FIG. 4A. As further shown in the figure, the locking lever 114 is in the open position, held there by the spring-loaded detent assembly 210 according to some embodiments, and the latching clip 110 is pulled into the latched position by the biasing member 204.

Figure 4B:
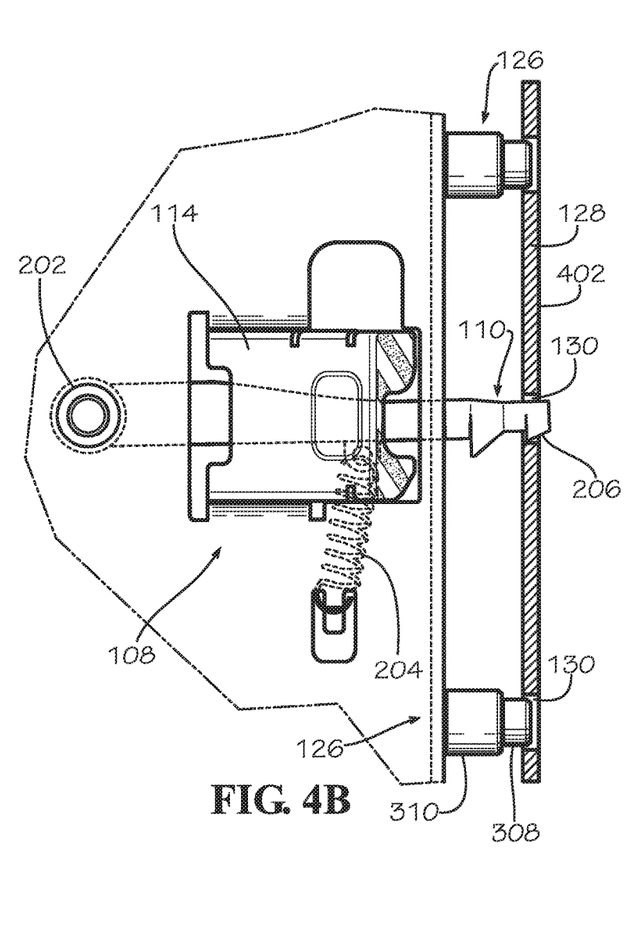
Figure 4C:
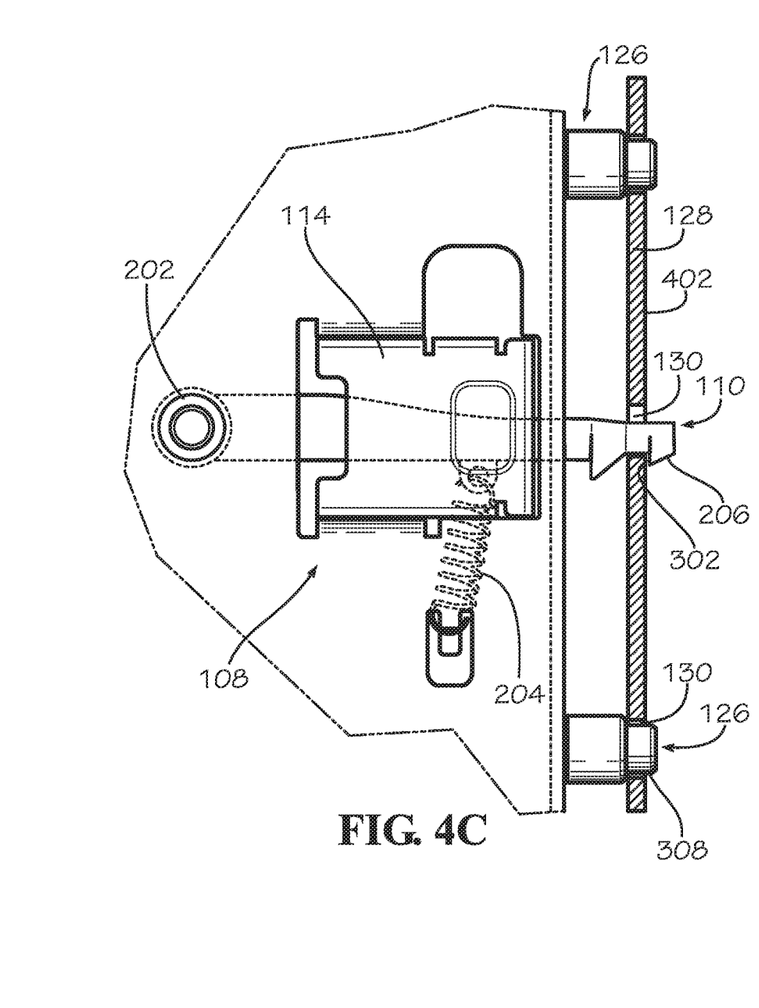

As shown in FIG. 4B, as the length of the rail-kit 100 is extended by telescoping the inner panel 116 and outer panel 124 with respect to one another, the sloped face of the first catch 206 at the distal end of latching clip 110 engages an inner edge of the corresponding aperture 130 in the rack post 128, causing the latching clip 110 to rotate about the latch hinge 202 and deflect upward into the engagement position. At the same time, the chamfered edges of the load-bearing pegs 126 similarly guide the pegs into the corresponding apertures 130 on the rack post 128. As the length of the rail-kit 100 is further extended, the first catch 206 of the latching clip 110 passes through the aperture 130 and the biasing member 204 pulls the latching clip 110 back into the latched position so that the first catch surface 302 engages the outer surface 402 of the rack post 128, thereby preventing the latching clip 110 from pulling out of the aperture 130, as shown in FIG. 4C. In addition, the first engagement surface 308 of the flanking load-bearing pegs 126 have fully engaged the corresponding apertures 130 in the rack posts 128, allowing them to support the weight of the rail-kit 100. Placing the locking lever 114 in the closed position completes the double-lock effect which prevents the disengagement of the latching clip 110 from the latched position, thereby preventing the load-bearing pegs 126 from pulling out of the corresponding apertures 130.

Figure 4D:
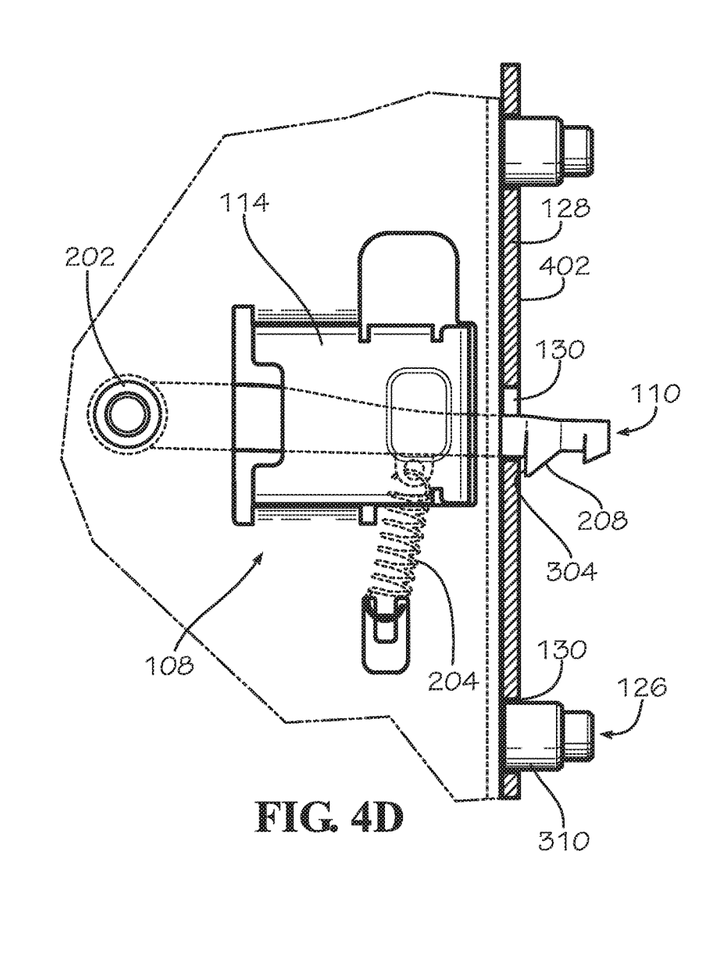

FIG. 4D is similar to FIG. 4C, but instead shows an end of the rail-kit 100 fully installed in a rack having rack posts 128 with larger, square apertures 130. As shown, both the first catch 206 and second catch 208 have cleared the square aperture 130 and the biasing member 204 has pulled the latching clip 110 from the engagement position to the latched position so that the second catch surface 304 overhangs the edge of the aperture 130 and is engaged with the outer surface 402 of the rack post 128, preventing the latching clip 110 from pulling out of the aperture. Similarly, the larger diameter second engagement surface 310 of the flanking load-bearing pegs 126 have fully engaged the corresponding apertures 130 in the rack posts 128, allowing them to support the weight of the rail-kit 100. Similar to FIG. 4C, in this position, placing the locking lever 114 in the closed position completes the double-lock effect which prevents the disengagement of the latching clip 110 from the latched position.

Based on the foregoing, it will be appreciated that technologies for tool-free, quick-install rail-kits for installing heavy-weight equipment in rack systems are presented herein. While some embodiments are described herein in regard to 19-inch equipment racks, it will also be appreciated that the embodiments described in this disclosure may be utilized with any four post rack system in which rail-kits or slides are utilized for the installation of equipment, with the various latching clips, load-bearing pegs, engagement surfaces, and the like configured based on the corresponding rack system specifications. The above-described embodiments are merely possible examples of implementations, merely set forth for a clear understanding of the principles of the present disclosure.

It will be further appreciated that conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more particular embodiments or that one or more particular embodiments necessarily include logic for deciding, with or without user input or prompting, whether these features, elements and/or steps are included or are to be performed in any particular embodiment.

Many variations and modifications may be made to the above-described embodiments without departing substantially from the spirit and principles of the present disclosure. Further, the scope of the present disclosure is intended to cover any and all combinations and sub-combinations of all elements, features, and aspects discussed above. All such modifications and variations are intended to be included herein within the scope of the present disclosure, and all possible claims to individual aspects or combinations of elements or steps are intended to be supported by the present disclosure.

What is claimed is:

1. A system comprising:
a telescoping rail body comprising an inner panel and an outer panel slidably fastened to one another; and
self-latching mechanisms disposed at opposite ends of the inner panel and the outer panel, each self-latching mechanism comprising
a latching clip having at least one catch surface, the latching clip pivotally fastened to the associated panel and biased by a biasing member in a latched position, the latching clip configured to pass through an aperture of a rack post and engage an outer surface of the rack post with the at least one catch surface, and
a locking lever positioned on an inward facing surface of the associated panel and configured to open inwardly to unlock the latching clip allowing the latching clip to pivot and to close flush with the inward facing surface to lock the latching clip in the latched position.

2. The system of claim 1, wherein the locking lever is configured to open inwardly and oriented such that installation of equipment in a rack system is prevented when the locking lever is in an open position.

3. The system of claim 1, wherein the locking lever is configured to open inwardly and is oriented such that inserting of equipment into a rail-kit forces the locking lever into a closed position.

4. The system of claim 1, wherein the self-latching mechanism further comprises a spring-loaded detent assembly configured to hold the locking lever in an open position during installation into the system.

5. A system comprising:
a telescoping rail body comprising an inner panel and an outer panel slidably fastened to one another; and
self-latching mechanisms disposed at opposite ends of the inner panel and the outer panel, each self-latching mechanism comprising
a latching clip having at least one catch surface, the latching clip pivotally fastened to the associated panel and biased by a biasing member in a latched position, the latching clip configured to pass through an aperture of a rack post and engage an outer surface of the rack post with the at least one catch surface, and
a locking lever positioned on an inward facing surface of the associated panel and configured to open inwardly to unlock the latching clip allowing the latching clip to pivot and to close flush with the inward facing surface to lock the latching clip in the latched position,
wherein the latching clip comprises a first catch surface and a second catch surface, the first catch surface configured to engage the outer surface of rack posts having small apertures, and the second catch surface configured to engage the outer surface of rack posts having large apertures.

6. The system of claim 5, wherein the latching clip is shaped such that the first catch surface is configured to pass through and engage round-shaped apertures, and the second catch surface is configured to pass through and engage square-shaped apertures.

7. A system comprising:
a telescoping rail body comprising an inner panel and an outer panel slidably fastened to one another;
self-latching mechanisms disposed at opposite ends of the inner panel and the outer panel, each self-latching mechanism comprising
a latching clip having at least one catch surface, the latching clip pivotally fastened to the associated panel and biased by a biasing member in a latched position, the latching clip configured to pass through an aperture of a rack post and engage an outer surface of the rack post with the at least one catch surface, and
a locking lever positioned on an inward facing surface of the associated panel and configured to open inwardly to unlock the latching clip allowing the latching clip to pivot and to close flush with the inward facing surface to lock the latching clip in the latched position; and
one or more pegs rigidly disposed from the opposite ends of the inner panel and the outer panel, the one or more pegs having at least one engagement surface configured to engage apertures of the rack post and to bear the vertical load of a rail-kit and equipment installed in the system.

8. The system of claim 7, wherein each of the one or more pegs comprise a first engagement surface configured to pass through and engage apertures in rack posts having small apertures, and a second engagement surface configured to pass through and engage apertures in rack posts having large apertures.

9. The system of claim 1, further comprising a horizontal ledge disposed from a bottom of the inner panel configured to receive equipment and bear the vertical load of the equipment installed in the system.

* * * * *